United States Patent
Hao et al.

(10) Patent No.: US 10,564,780 B2
(45) Date of Patent: Feb. 18, 2020

(54) TRANSPARENT CONDUCTORS INCLUDING METAL TRACES AND METHODS OF MAKING SAME

(71) Applicant: 3M INNOVATIVE PROPERTIES COMPANY, St. Paul, MN (US)

(72) Inventors: Encai Hao, Woodbury, MN (US); Matthew S. Stay, Minneapolis, MN (US); Albert I. Everaerts, Tucson, AZ (US); Mahfuza B. Ali, Mendota Heights, MN (US); Yizhong Wang, Woodbury, MN (US); Kevin M. Lewandowski, Inver Grove Heights, MN (US); Corey J. Radloff, St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 7 days.

(21) Appl. No.: 15/747,958

(22) PCT Filed: Aug. 17, 2016

(86) PCT No.: PCT/US2016/047268
§ 371 (c)(1),
(2) Date: Jan. 26, 2018

(87) PCT Pub. No.: WO2017/034870
PCT Pub. Date: Mar. 2, 2017

(65) Prior Publication Data
US 2018/0217697 A1  Aug. 2, 2018

Related U.S. Application Data

(60) Provisional application No. 62/208,031, filed on Aug. 21, 2015.

(51) Int. Cl.
*G06F 3/044* (2006.01)
*H05K 1/02* (2006.01)
(Continued)

(52) U.S. Cl.
CPC .......... *G06F 3/044* (2013.01); *H05K 1/0274* (2013.01); *H05K 1/09* (2013.01); *H05K 3/285* (2013.01);
(Continued)

(58) Field of Classification Search
CPC ......... B82Y 20/00; B82Y 30/00; C09D 11/52; C23F 11/02; C30B 29/02; C30B 29/60;
(Continued)

(56) References Cited

U.S. PATENT DOCUMENTS 4,015,166 A   3/1977   Ohshima
4,262,072 A   4/1981   Wendling
(Continued)

FOREIGN PATENT DOCUMENTS

CN   101246914   8/2008
CN   101262024   9/2008
(Continued)

OTHER PUBLICATIONS

Folarin, "Polymer-noble metal nanocomposites: Review", International Journal of the Physical Sciences, Sep. 2011, vol. 6, No. 21, pp. 4869-4882.
(Continued)

*Primary Examiner* — Nelson M Rosario
(74) *Attorney, Agent, or Firm* — Clifton F. Richardson (57) ABSTRACT

A transparent conductor is provided, including a visible light transparent substrate and metal traces disposed on the substrate, and a layer of a second metal deposited on at least a portion of the metal traces. The transparent conductor further includes a layer of a second metal, which conforms to
(Continued)

the surface structure of the metal traces on which it is deposited. Optionally, the transparent conductor also includes a coating layer disposed on a portion of the metal traces and the substrate surface. The coating layer includes a polymer prepared from a polymerizable composition containing at least one ionic liquid monomer. A method of forming a transparent conductor is also provided, including obtaining a visible light transparent substrate having metal traces disposed on the substrate and applying a coating composition on a portion of the metal traces and substrate. The coating composition contains at least one noble metal salt and at least one polymerizable ionic liquid monomer.

17 Claims, 3 Drawing Sheets (51) Int. Cl.
H05K 1/09 (2006.01)
H05K 3/28 (2006.01)
(52) U.S. Cl.
CPC ............ *G06F 2203/04103* (2013.01); *G06F 2203/04112* (2013.01); *H05K 2201/0108* (2013.01); *H05K 2201/0338* (2013.01); *H05K 2201/09245* (2013.01); *H05K 2201/10151* (2013.01); *H05K 2203/0143* (2013.01); *H05K 2203/0759* (2013.01); *H05K 2203/0783* (2013.01)
(58) Field of Classification Search
CPC ....... C30B 33/00; C30B 7/02; G02F 1/13439; H01B 1/22; B22F 1/0025; B22F 2998/00; C03C 2217/445; C03C 2217/479; C03C 17/007; C03C 17/008; H01L 2224/45139; H01L 2224/49175; H01L 27/14623; H01L 2924/00011; H01L 2924/12044; H01L 2924/3011; H01L 31/02164; H01L 31/022466; H05K 1/0269; H05K 1/097; H05K 2201/0145; H05K 2201/0154; H05K 2201/026; H05K 2201/10128; H05K 2203/1545; H05K 3/048; Y10S 977/762

See application file for complete search history.

(56) References Cited

U.S. PATENT DOCUMENTS

| | | | |
|---|---|---|---|
| 5,126,007 A | 6/1992 | Schmulovich | |
| 5,492,611 A | 2/1996 | Sugama | |
| 5,793,505 A | 8/1998 | Shurtz, II | |
| 6,090,473 A | 7/2000 | Yoshikawa | |
| 6,522,463 B1 | 2/2003 | Shimomura | |
| 6,686,536 B2 | 2/2004 | Tone | |
| 6,775,907 B1 | 8/2004 | Boyko | |
| 6,924,329 B2 | 8/2005 | Klun | |
| 7,494,710 B2 | 2/2009 | Ishihara | |
| 7,713,604 B2 | 5/2010 | Yang | |
| 8,022,432 B2 | 9/2011 | Yi | |
| 8,174,510 B2 | 5/2012 | Polishchuk | |
| 8,207,013 B2 | 6/2012 | Yang | |
| 8,486,537 B2 | 7/2013 | Whitcomb | |
| 8,633,474 B2 | 1/2014 | De la Vega | |
| 8,637,859 B2 | 1/2014 | Pschenitzka | |
| 8,703,232 B2 | 4/2014 | Stay | |
| 2004/0090170 A1 | 5/2004 | Cha | |
| 2004/0160183 A1 | 8/2004 | Kim | |
| 2004/0206960 A1 | 10/2004 | Nishikawa | |
| 2005/0288166 A1 | 12/2005 | Cha | |
| 2008/0210052 A1 | 9/2008 | Allemand | |
| 2008/0286447 A1 | 11/2008 | Alden | |
| 2009/0133922 A1 | 5/2009 | Okazaki | |
| 2009/0321113 A1 | 12/2009 | Allemand | |
| 2009/0321364 A1 | 12/2009 | Spaid | |
| 2011/0007011 A1 | 1/2011 | Mozdzyn | |
| 2011/0021691 A1* | 1/2011 | Chiang | C07C 219/08 524/521 |
| 2011/0031001 A1 | 2/2011 | Ishikawa | |
| 2011/0162870 A1 | 7/2011 | Markovich | |
| 2011/0174190 A1 | 7/2011 | Sepa | |
| 2011/0192633 A1 | 8/2011 | Allemand | |
| 2011/0215290 A1 | 9/2011 | Choi | |
| 2011/0216020 A1 | 9/2011 | Lee | |
| 2011/0217455 A1 | 9/2011 | Veerasamy | |
| 2011/0285019 A1* | 11/2011 | Alden | B82Y 30/00 257/741 |
| 2012/0061625 A1 | 3/2012 | Eckert | |
| 2012/0088240 A1 | 4/2012 | Baker | |
| 2012/0104374 A1 | 5/2012 | Allemand | |
| 2012/0118617 A1 | 5/2012 | Bories-Azeau | |
| 2012/0288675 A1 | 11/2012 | Klun | |
| 2012/0301737 A1 | 11/2012 | Labelle | |
| 2012/0319963 A1 | 12/2012 | Lee | |
| 2012/0320312 A1 | 12/2012 | Yang | |
| 2013/0040516 A1 | 2/2013 | Pruneri | |
| 2013/0120846 A1 | 5/2013 | Dai | |
| 2013/0165189 A1 | 6/2013 | Shoji | |
| 2013/0194220 A1 | 8/2013 | Lee | |
| 2013/0221992 A1 | 8/2013 | Fan | |
| 2013/0276877 A1 | 10/2013 | Dionne | |
| 2013/0328575 A1 | 10/2013 | Ra | |
| 2013/0293096 A1 | 11/2013 | Kang | |
| 2013/0299222 A1 | 11/2013 | Lee | |
| 2013/0323482 A1 | 12/2013 | Poon | |
| 2014/0008106 A1 | 1/2014 | Wright | |
| 2014/0016043 A1 | 1/2014 | Chen | |
| 2014/0017508 A1 | 1/2014 | Lee | |
| 2014/0020737 A1 | 1/2014 | Jung | |
| 2014/0022467 A1 | 1/2014 | Chai | |
| 2014/0054516 A1 | 2/2014 | Moon | |
| 2014/0099486 A1 | 4/2014 | Ollmann | |
| 2014/0110638 A1 | 4/2014 | Miyagishima | |
| 2014/0186587 A1 | 7/2014 | Shin | |
| 2014/0205827 A1 | 7/2014 | Mun | |
| 2014/0224321 A1 | 8/2014 | Lim | |
| 2014/0238833 A1 | 8/2014 | Virkar | |
| 2014/0251086 A1 | 9/2014 | Peng | |
| 2014/0251662 A1 | 9/2014 | Rotto | |
| 2014/0287639 A1 | 9/2014 | Lee | |
| 2014/0302326 A1 | 10/2014 | Shin | |
| 2015/0140287 A1 | 5/2015 | Poon | |

FOREIGN PATENT DOCUMENTS

| | | |
|---|---|---|
| CN | 102087884 | 6/2011 |
| CN | 102153138 | 8/2011 |
| CN | 102227002 | 10/2011 |
| CN | 102468349 | 5/2012 |
| CN | 102468350 | 5/2012 |
| CN | 102737786 | 10/2012 |
| CN | 103107213 | 5/2013 |
| CN | 103203467 | 7/2013 |
| CN | 103909257 | 7/2014 |
| CN | 104008819 | 8/2014 |
| CN | 104011804 | 8/2014 |
| EP | 0887834 | 12/1998 |
| EP | 2477230 | 7/2012 |
| JP | 63225463 | 9/1988 |
| JP | 01186538 | 7/1989 |
| JP | 11184385 | 7/1999 |
| JP | 2001319602 | 11/2001 |
| JP | 2002014772 | 1/2002 |
| JP | 2005084475 | 3/2005 |
| JP | 2007207841 | 8/2007 |
| JP | 2007328092 | 12/2007 |
| JP | 2007328286 | 12/2007 |
| JP | 2008024887 | 2/2008 |
| JP | 2008041810 | 2/2008 |
| JP | 2008042025 | 2/2008 |
| JP | 2008197409 | 8/2008 |

(56) References Cited

FOREIGN PATENT DOCUMENTS

| | | |
|---|---|---|
| JP | 2008251822 | 10/2008 |
| JP | 2009069472 | 4/2009 |
| JP | 2010080316 | 4/2010 |
| JP | 2010135708 | 6/2010 |
| JP | 5345859 | 7/2010 |
| JP | 5308264 | 2/2011 |
| JP | 5443877 | 2/2011 |
| JP | 5600457 | 10/2011 |
| JP | 5548051 | 1/2012 |
| JP | 2012014956 | 1/2012 |
| JP | 2012089361 | 5/2012 |
| JP | 2012150893 | 8/2012 |
| JP | 2014194655 | 9/2014 |
| KR | 20110071539 | 6/2011 |
| KR | 20130117156 | 10/2013 |
| KR | 20140058892 | 5/2014 |
| KR | 20140095862 | 8/2014 |
| WO | WO 2007-088992 | 8/2007 |
| WO | WO 2008-143714 | 11/2008 |
| WO | WO 2011-106438 | 9/2011 |
| WO | WO 2011-125981 | 10/2011 |
| WO | WO 2013-069870 | 5/2013 |
| WO | WO 2013-115310 | 8/2013 |
| WO | WO 2013-141318 | 9/2013 |
| WO | WO 2014-017658 | 1/2014 |
| WO | WO 2014-020656 | 2/2014 |
| WO | WO 2014-084562 | 6/2014 |
| WO | WO 2014-088950 | 6/2014 |
| WO | WO 2014-161381 | 10/2014 |

OTHER PUBLICATIONS

Kim, "Highly Transparent Au-Coated Ag Nanowire Transparent Electrode with Reduction in Haze", ACS Applied Materials & Interfaces, Jul. 2014, vol. 6, No. 16, pp. 13527-13534, XP55313079.

Langley, "Flexible transparent conductive materials based on silver nanowire networks: a review", Nanotechnology, Nov. 2013, vol. 24, No. 45, pp. 452001(20pp).

Preston, "Optical haze of transparent and conductive silver nanowire films", Nano Research, 2013, vol. 6, No. 7, pp. 461-468.

Sun, "Increased Sensitivity of Surface Plasmon Resonance of Gold Nanoshells Compared to That of Gold Solid Colloids in Response to Environmental Changes", Analytical Chemistry, Oct. 2002, vol. 74, No. 20, pp. 5297-5305.

International Search Report for PCT International Application No. PCT/US2016/047268, dated Nov. 4, 2016, 5 pages.

\* cited by examiner

TRANSPARENT CONDUCTORS INCLUDING METAL TRACES AND METHODS OF MAKING SAME

TECHNICAL FIELD

The present disclosure relates to transparent conductors and methods of making transparent conductors, such as transparent conductors for use in touch sensors.

BACKGROUND

There is a need in the art for improved transparent conductors. Silver nanowires (AgNW), Cu mesh, Ag mesh, and Ag halide, also referred to as indium tin oxide (ITO) alternatives, have been employed in products instead of ITO for certain applications. This is a reflection of the increasing application of capacitive touch panels, which allow for touch inputs by swiping a finger across the screen. Conductors including ITO have too high of a resistance to be employed in some large-sized applications. Conductors including the above-mentioned non-ITO materials, however, have low resistance relative to ITO, thus they can allow capacitive touch panels to be employed for such large-sized applications as all-in-one personal computers and electronic boards. Non-ITO conductors can also be flexible, lending themselves to next-generation flexible displays.

SUMMARY

The present disclosure provides transparent conductors and methods of making transparent conductors. More particularly, the transparent conductors include metal traces.

In a first aspect, the present disclosure provides a transparent conductor. The transparent conductor includes a visible light transparent substrate and a plurality of metal traces disposed on a major surface of the substrate. The metal traces comprise a first metal and have a structured surface. The transparent conductor further includes a layer of a second metal deposited on a portion of the structured surface of the plurality of metal traces and the layer conforms to the portion of the structured surface on which it is deposited.

In a second aspect, the present disclosure provides another transparent conductor. The transparent conductor includes a visible light transparent substrate and a plurality of metal traces disposed on a major surface of the substrate. The metal traces comprise a first metal. The transparent conductor further includes a layer of a second metal deposited on a portion of the plurality of metal traces and a coating layer disposed on the layer of the second metal and at least a portion of the visible light transparent substrate. The coating layer includes a polymer prepared from a polymerizable composition including at least one ionic liquid monomer.

In a third aspect, the present disclosure provides a method of method of forming a transparent conductor. The method includes obtaining a visible light transparent substrate including a plurality of metal traces disposed on a major surface of the substrate and applying a coating composition on a portion of the plurality of metal traces and at least a portion of the visible light transparent substrate. The coating composition includes at least one noble metal salt and at least one polymerizable ionic liquid monomer.

Various unexpected results and advantages are obtained in exemplary embodiments of the disclosure. One such advantage of exemplary embodiments of the present disclosure is the achievement of certain optical properties, such as low haze and low reflectance.

The above summary of the present disclosure is not intended to describe each disclosed embodiment or every implementation of the present disclosure. The description that follows more particularly exemplifies illustrative embodiments. In several places throughout the application, guidance is provided through lists of examples, which examples can be used in various combinations. In each instance, the recited list serves only as a representative group and should not be interpreted as an exclusive list.

BRIEF DESCRIPTION OF THE DRAWINGS

The disclosure may be more completely understood in consideration of the following detailed description of various embodiments of the disclosure in connection with the accompanying figures, in which.

While the above-identified figures, which may not be drawn to scale, relate to certain embodiments of the present disclosure, other embodiments are also contemplated, as noted in the Detailed Description.

DETAILED DESCRIPTION

Both metal nanowire and metal mesh based transparent conductors can have issues such as high haze (e.g., >1.5%) and obviously visible traces when the display is turned off (i.e., has a black background) due high reflectance from the metal traces. Such issues have limited metal nanowire and metal mesh conductors for certain uses, for instance in displays. An improvement in haze and/or reflectance could assist in accelerating the growth of these materials in transparent conductors.

For the following Glossary of defined terms, these definitions shall be applied for the entire application, unless a different definition is provided in the claims or elsewhere in the specification.

Glossary

Certain terms are used throughout the description and the claims that, while for the most part are well known, may require some explanation. It should be understood that, as used herein:

As used in this specification and the appended embodiments, the singular forms "a", "an", and "the" include plural referents unless the content clearly dictates otherwise. Thus, for example, reference to components containing "a compound" includes a mixture of two or more compounds. As used in this specification and the appended embodiments, the term "or" is generally employed in its sense including "and/or" unless the content clearly dictates otherwise.

As used in this specification, the recitation of numerical ranges by endpoints includes all numbers subsumed within that range (e.g., 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

The terms "comprises" and variations thereof do not have a limiting meaning where these terms appear in the description and claims.

The term "acryloyl" is used in a generic sense and means not only derivatives of acrylic acid, but also amine, and alcohol derivatives, respectively.

The term "(meth)acryloyl" includes both acryloyl and methacryloyl groups; i.e., is inclusive of both esters and amides.

The term "poly(meth)acryloyl" means a compound having two or more (meth)acryloyl groups that may function as Michael acceptors.

The term "curable" means that a coatable material can be transformed into a solid, substantially non-flowing material by means of cooling (to solidity hot melts), heating (to dry and solidify materials in a solvent), chemical cross linking, radiation crosslinking, or the like.

The term "alkyl" includes straight-chained, branched, and cyclic alkyl groups and includes both unsubstituted and substituted alkyl groups. Unless otherwise indicated, the alkyl groups typically contain from 1 to 20 carbon atoms. Examples of "alkyl" groups as used herein include, but are not limited to, methyl, ethyl, n-propyl, n-butyl, n-pentyl, isobutyl, t-butyl, isopropyl, n-octyl, n-heptyl, ethylhexyl, cyclopentyl, cyclohexyl, cycloheptyl, adamantyl, and nor- bornyl, and the like. Unless otherwise noted, alkyl groups may be mono- or polyvalent.

The term "heteroalkyl" includes straight-chained, branched, and cyclic alkyl groups with one or more heteroatoms independently selected from S, O, and N with both unsubstituted and substituted alkyl groups. Unless otherwise indicated, the heteroalkyl groups typically contain from 1 to 20 carbon atoms. "Heteroalkyl" is a subset of "hydrocarbyl containing one or more S, N, O, P, or Si atoms" described below. Examples of "heteroalkyl" as used herein include, but are not limited to, methoxy, ethoxy, propoxy, 3,6-dioxaheptyl, 3-(trimethylsilyl)-propyl, 4-dimethylaminobutyl, and the like. Unless otherwise noted, heteroalkyl groups may be mono- or polyvalent.

The term "aryl" is an aromatic group containing 6-18 ring atoms and can contain optional fused rings, which may be saturated, unsaturated, or aromatic. Examples of aryl groups include phenyl, naphthyl, biphenyl, phenanthryl, and anthracyl. Heteroaryl is an aryl group containing 1-3 heteroatoms such as nitrogen, oxygen, or sulfur and can contain fused rings. Some examples of heteroaryl groups are pyridyl, furanyl, pyrrolyl, thienyl, thiazolyl, oxazolyl, imidazolyl, indolyl, benzofuranyl, and benzthiazolyl. Unless otherwise noted, aryl and heteroaryl groups may be mono- or polyvalent.

The term "(hetero)hydrocarbyl" is inclusive of hydrocarbyl alkyl and aryl groups, and heterohydrocarbyl heteroalkyl and heteroaryl groups, the latter comprising one or more catenary oxygen heteroatoms such as ether or amino groups. Heterohydrocarbyl may optionally contain one or more catenary (in-chain) functional groups including ester, amide, urea, urethane, and carbonate functional groups. Unless otherwise indicated, the non-polymeric (hetero)hydrocarbyl groups typically contain from 1 to 60 carbon atoms. Some examples of such heterohydrocarbyls as used herein include, but are not limited to, methoxy, ethoxy, propoxy, 4-diphenylaminobutyl, 2-(2'-phenoxyethoxy)ethyl, 3,6-dioxaheptyl, 3,6-dioxahexyl-6-phenyl, in addition to those described for "alkyl", "heteroalkyl", "aryl", and "heteroaryl" supra.

The term "random structure" refers to a structure that is not uniform in shape or size. Hence, having a random structure is exclusive of microreplicated structures and otherwise regularly formed structures.

The term "nanoscale structure" refers to a structure having a face or side that has a dimension of between 1 nanometer and 999 nanometers, inclusive.

The term "transparent" refers to an article that has a light transmission of at least 2%, or at least 5%, or at least 10%, or at least 15%, or at least 20%, or at least 30%, or at least 40%, or at least 50%, or at least 60%, or at least 70%, or at least 80%, or at least 90%, or up to 100%, or up to 99%, or up to 98%, or up to 95%, or up to 92%. Typically, the light is of a wavelength of about 390 nm to 700 nm.

When a group is present more than once in a formula described herein, each group is "independently" selected, whether specifically stated or not. For example, when more than one R group is present in a formula, each R group is independently selected.

Reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment," "in many embodiments" or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

Various exemplary embodiments of the disclosure will now be described. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the limitations set forth in the claims and any equivalents thereof.

It has been discovered that a transparent conductor having advantageous optical properties, such as reduced haze and/or reflectance, can be made using metal nanowires or metal mesh as the conductive material. More particularly, upon contacting a metal mesh or metal nanowires with a noble metal salt capable of oxidizing the metal of the metal mesh or metal nanowires, the noble metal salt will react with the metal nanowires or metal mesh to form a structured surface with a layer of the noble metal deposited on the structured surface. This reaction generally leads to reduced reflection, lowered haze, and darkening of the nanowire or mesh traces. Hence, in certain embodiments this oxidation reaction enables a decrease in the visibility of metal mesh or metal nanowire electrodes assembled in touch sensors, particularly when the displays are in the "off" state. Polymerizable ionic liquid monomers, acrylates, and noble metal salts (such as $HAuCl_4$, $PdCl_2$, or $H_2PtCl_6$) are typically included in formulations that contact the metal mesh or metal nanowires, and the polymerizable ionic liquid monomers act as a solvent (e.g., host matrix) for the noble metal salts. Such formulations can often be formulated as optically clear coatings and/or adhesives.

In certain embodiments, a gold metal salt may be contacted with a silver trace (nanowire or mesh), and the following chemical reaction will occur: $Au^{3+}+3Ag^0 \rightarrow 3Ag^+ +Au^0$. The loss of three silver atoms from the silver trace for each gold atom results in the formation of the structured surface of the silver trace in the locations from which silver atoms are lost because silver atoms are not lost evenly over the surface of the trace. Similarly, a palladium salt or a platinum salt may be contacted with a silver trace in accordance with the following chemical reactions: $Pd^{2+}+2Ag^0 \rightarrow 2Ag^- +Pd^0$; and $Pt^{4+}+4Ag^0 \rightarrow 4Ag^+ +Pt^0$. In the locations where the silver atoms are oxidized to silver ions, the silver trace will have a structured surface, with a greater thickness at the locations of unreacted silver trace than at the locations where silver atoms were oxidized and removed from the silver trace. The noble metal deposits on the structured surface of the trace in conformation with the structured surface of the metal trace. In certain embodiments, the structured surface comprises a random structure, a nanoscale structure, or both a random structure and a nanoscale structure, as a result of the oxidation of the metal trace by the noble metal salt.

In a first aspect, the present disclosure provides a transparent conductor. The transparent conductor includes a visible light transparent substrate and a plurality of metal traces disposed on a major surface of the substrate. The metal traces comprise a first metal and have a structured surface. The transparent conductor further includes a layer of a second metal deposited on a portion of the structured surface of the plurality of metal traces and the layer conforms to the portion of the structured surface on which it is deposited.

Figure 1:
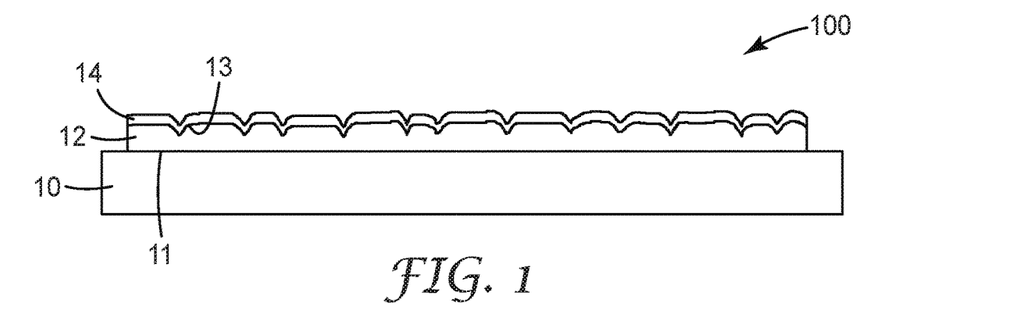
FIG. 1 is a schematic cross-sectional view of an exemplary transparent conductor (taken through a metal trace), according to the disclosure.

Referring to FIG. 1, a schematic cross-sectional view of an exemplary transparent conductor is provided. The transparent conductor 100 comprises a visible light transparent substrate 10; a plurality of metal traces 12 disposed on a major surface 11 of the substrate 10, the metal traces 12 comprising a first metal and having a structured surface 13; and a layer of a second metal 14 deposited on a portion of the structured surface 13 of the plurality of metal traces 12, wherein the layer of the second metal 14 conforms to the portion of the structured surface 13 of the metal traces 12 on which it is deposited. The schematic cross-sectional view of FIG. 1 is taken along an axis of a single metal trace in order to better illustrate that there is a structured surface on the metal trace.

In a second aspect, the present disclosure provides another transparent conductor. The transparent conductor includes a visible light transparent substrate and a plurality of metal traces disposed on a major surface of the substrate. The metal traces comprise a first metal. The transparent conductor further includes a layer of a second metal deposited on a portion of the plurality of metal traces and a coating layer disposed on the layer of the second metal and at least a portion of the visible light transparent substrate. The coating layer includes a polymer prepared from a polymerizable composition including at least one ionic liquid monomer.

Figure 2:
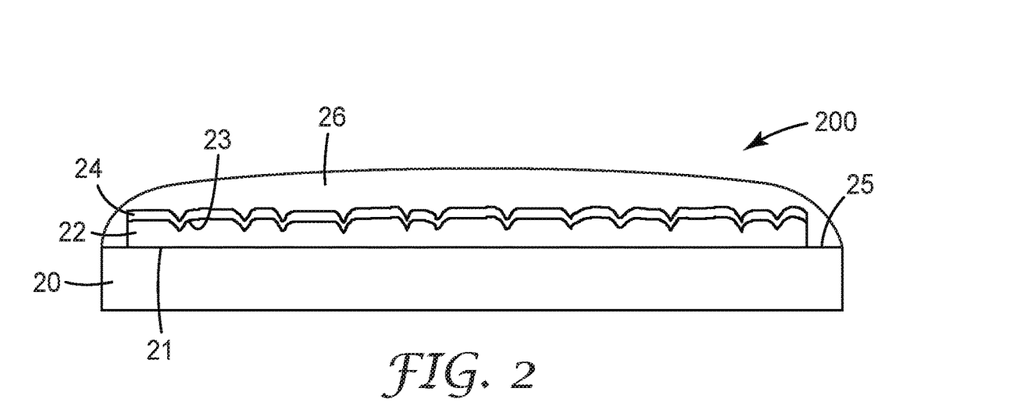
FIG. 2 is a schematic cross-sectional view of another exemplary transparent conductor (taken through a metal trace), according to the disclosure.

Referring to FIG. 2, a schematic cross-sectional view of an exemplary transparent conductor according to the second aspect is provided. The transparent conductor 200 comprises a visible light transparent substrate 20; a plurality of metal traces 22 disposed on a major surface 21 of the substrate 20, the metal traces 22 comprising a first metal; a layer of a second metal 24 deposited on a portion of the plurality of metal traces 20; and a coating layer 26 disposed on the layer of the second metal 24 and at least a portion of the visible light transparent substrate 20, the coating layer 26 comprising a polymer prepared from a polymerizable composition comprising at least one ionic liquid monomer. The schematic cross-sectional view of FIG. 2 is taken along an axis of a single metal trace in order to better illustrate that there is a structured surface on the metal trace.

In a third aspect, the present disclosure provides a method of method of forming a transparent conductor. The method includes obtaining a visible light transparent substrate including a plurality of metal traces disposed on a major surface of the substrate and applying a coating composition on a portion of the plurality of metal traces and at least a portion of the visible light transparent substrate. The coating composition includes at least one noble metal salt and at least one polymerizable ionic liquid monomer.

Figure 3:
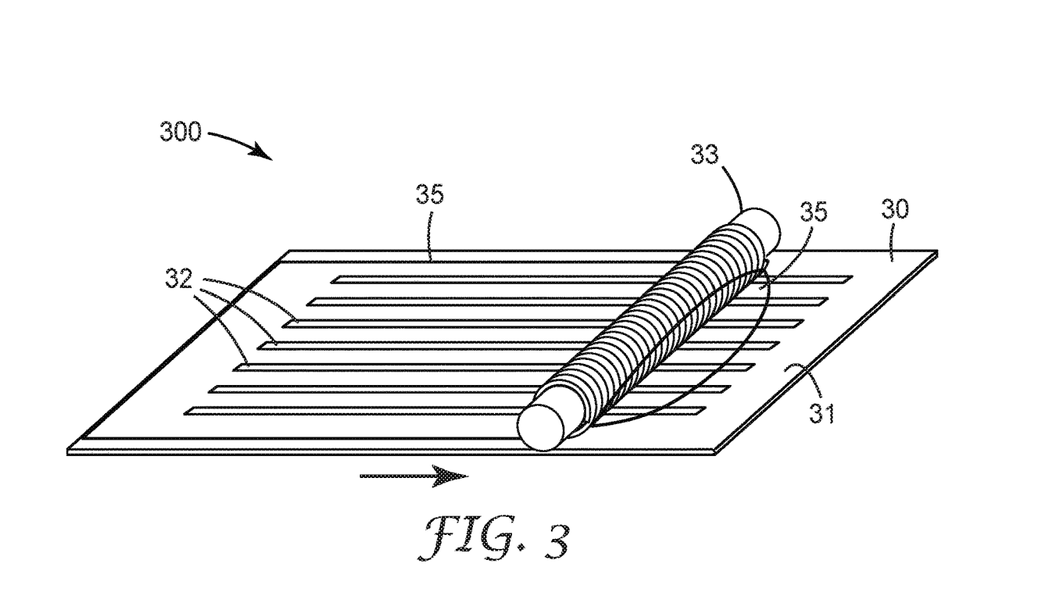
FIG. 3 is a schematic perspective view of an exemplary application of a coating composition to a transparent conductor, according to the disclosure.

Referring to FIG. 3, a schematic perspective view of an exemplary method according to the third aspect is provided. The method includes obtaining a visible light transparent substrate 30 including a plurality of metal traces 32 disposed on a major surface 31 of the substrate 30 and applying a coating composition 35 on a portion of the plurality of metal traces 32 and at least a portion of the visible light transparent substrate 30. For instance, a wire wound rod 33 may be employed to apply the coating 35 across the substrate 30 in the direction indicated by the arrow in FIG. 3. The coating composition includes at least one noble metal salt and at least one polymerizable ionic liquid monomer.

The disclosure below relates to each of the first through third aspects.

Advantageously, the ionic liquid monomer solubilizes the noble metal salt in the coating composition without necessarily requiring the presence of any typical solvents. In certain embodiments, the coating composition comprises less than 5% by weight of solvent, or less than 3% by weight of solvent, or less than 2% by weight of solvent, or less than 1% by weight of solvent.

Suitable ionic liquid monomers include for example and without limitation a polymerizable anion and a cation of the following formula:

wherein

Z comprises a ketone, ester, amide, nitrile, or azlactone functional group, $R^1$ is H or a $C_1$-$C_{25}$ alkyl group, $R^2$ is H or —CO—$X^1$—$R^5$, where $R^5$ is a H or a $C_1$-$C_{25}$ alkyl group and $X^1$ is —O— or —$NR_6$—, where $R^6$ is H or a $C_1$-$C_6$ alkyl; and $R^3$ is H or $CH_3$, $R^8$ is a (hetero)hydrocarbyl group, and w is 0, 1, 2 or 3; with the proviso that when Z comprises a nitrile or azlactone functional group, then $R^1$ and $R^2$ is H.

In certain embodiments, the polymerizable anion comprises an ethylenically unsaturated polymerizable group and an acidic group selected from a carboxylic acid group (—COOH), a sulfonic acid group (—$SO_3H$), a sulfate group (—$SO_4H$), a phosphonic acid group (—$PO_3H_2$), a phosphate group (—$OPO_3H$), or a salt thereof.

In certain select embodiments, the at least one ionic liquid monomer comprises trimethylacryloxyethyl ammonium bis(trifluoromethyl)sulfonamide.

In certain embodiments, the at least one ionic liquid monomer comprises at least one polymerizable onium salt having an anion, as disclosed in U.S. Application Publication No. 2012/0288675 (Klun et al.). Suitable onium salts can be selected from the group consisting of: ammonium salts, sulfonium salts, phosphonium salts, pyridinium salts, and imidazolium salts. Particularly suitable onium salts for use as the ionic liquid monomer have the following formula:

wherein each $R^1$ comprises independently an alkyl, alicyclic, aryl, alkalicyclic, alkaryl, alicyclicalkyl, aralicyclic, or alicyclicaryl moiety, wherein such moiety may comprises one or more heteroatoms such as for example, nitrogen, oxygen, or sulfur, or may comprise phosphorus, or a halogen (and thus can be fluoroorganic in nature), $R^1$ may be cyclic or aromatic and may include $G^+$ in the cycle;

G is nitrogen, sulfur or phosphorus;

a is 3 where G is sulfur and a is 4 where G is nitrogen or phosphorus;

b is an integer of 1 to 3 where G is sulfur and b is an integer of 1 to 4 where G is nitrogen or phosphorus;

q is an integer from 1 to 4;

D is oxygen, sulfur, or NR wherein R is H or a lower alkyl of 1 to 4 carbon atoms;

$R^2$ is a (meth)acryl; and $X^-$ is an anion, preferably an organic anion, and more preferably a fluoroorganic anion.

In some embodiments, in which $G^+$ is included in the cycle, the onium salt has one of the following formulas:

Illustrative examples of anions useful herein include alkyl sulfates, methane sulfonates, tosylates, fluoroorganics, fluoroinorganics, and halides.

Most preferably the anion is a fluorochemical anion. Fluoroorganic anions suitable for use herein include those described in U.S. Pat. No. 6,924,329 (Klun et al.), column 8, lines 2 to 65. The fluoroorganic ions provide greater solubility and compatibility of the onium salt with the non-onium polymerizable monomers, oligomers, or polymers. This is important in providing a coating with good clarity.

Some illustrative examples include —$C(SO_2CF_3)_3$, —$O_3SCF_3$, —$O_3SC_4F_9$, and —$N(SO_2CF_3)_2$. —$N(SO_2CF_3)_2$ provides a broader range of solubility than some of the alternatives, making compositions containing it somewhat easier to prepare and use.

The polymerizable composition typically contains at least enough ionic liquid monomer to solubilize the noble metal salt, and may further include additional components. For instance, in certain embodiments the polymerizable composition further comprises at least one acrylate or methacrylate monomer. Suitable acrylate or methacrylate monomers include for example and without limitation: (a) a hydroxyl terminated (lower alkyl or lower alkoxy lower alkyl) acrylate or methacrylate, e.g. 2-hydroxyethyl acrylate, 2-hydroxyethylene methacrylate, diethylene glycol monoacrylate, diethylene glycol monomethacrylate, 2-hydroxypropyl acrylate, 2-hydroxypropyl methacrylate 3-hydroxypropyl acrylate, 3-hydroxypropyl methacrylate and dipropylene glycol monomethacrylate, and ethoxylated monomer acrylate or methacylate, e.g. 2-ethoxyethoxyethyl acrylate, methoxy polyethylene glycol methacrylate, alkoxylated tetrahydrofurfuryl acrylate, phenol(EO)$_n$ acrylate (n>2); (b) diacryl containing compounds such as polyethylene glycol diacrylate, ethoxylated bisphenol-A diacrylate, ethoxylated bisphenol-A dimethacrylate Bisphenol fluorine (EO)$_n$ diacrylates (n≥6), neopentyl glycol diacrylate, polyethylene glycol diacrylate, propoxylated neopentyl glycol diacrylate, tetraethylene glycol diacrylate, tricyclodecanedimethanol diacrylate, triethylene glycol diacrylate, tripropylene glycol diacrylate; (c) triacryl containing compounds such as glycerol triacrylate, ethoxylated triacrylates (e.g., ethoxylated trimethylolpropane triacrylate, pentaerythritol triacrylate, propoxylated triacrylates (e.g., propoxylated glyceryl triacrylate, propoxylated trimethylolpropane triacrylate, tris(2-hydroxyethyl)isocyanurate triacrylate; (d) higher functionality acryl-containing compounds such as ditrimethylolpropane tetraacrylate, dipentaerythritol pentaacrylate, ethoxylated pentaerythritol tetraacrylate, pentaerythritol tetraacrylate, caprolactone modified dipentaerythritol hexaacrylate; (e) oligomeric acryl compounds such as, for example, urethane acrylates, polyester acrylates, epoxy acrylates; polyacrylamide analogues of the foregoing; and combinations thereof. Preferably, at least one hydrophilic monomer is employed for enhanced compatibility with the ionic liquid monomer(s).

Such compounds are available from vendors such as Sartomer Company, Exton, Pa.; Miwon Specialty Chemical Co., Ltd, Korea, KPX Green Chemical Co. ltd, Seoul, Korea, UCB Chemicals Corporation, Smyrna, Ga.; and Aldrich Chemical Company, Milwaukee, Wis. Additional useful acrylate materials include hydantoin moiety-containing polyacrylates, for example, as described in U.S. Pat. No. 4,262,072 (Wendling et al.).

The polymerizable composition could be a solid coating or pressure sensitive adhesive after fully cured. For pressure sensitive adhesive, the polymerizable composition comprises at least one adhesive monomer having a glass transition temperature less than −10 degrees Celsius, or less than −30 degrees Celsius, or less than −50 degrees Celsius. Preferred monomers include for example and without limitation, 2-ethoxyethoxyethyl acrylate (Viscoat 190 available from San Esters Corporation), phenol(EO)$_4$ acrylate and phenol(EO)$_6$ acrylate (Miramer M144 and Miramer 146 available from Miwon specialty Chemical Co. ltd.) alkoxylated tetrahydrofurfuryl acrylate (SR611 available from Sartomer Company), and combinations thereof.

In some embodiments, the method further comprises exposing the coating to irradiation to polymerize the at least one polymerizable ionic liquid monomer, thereby forming a coating layer (e.g., a coating layer 26 as illustrated in FIG. 2). In such embodiments, the polymerizable composition further includes at least one photoinitiator. Suitable photoinitiators include for example and without limitation, those available under the trade designations IRGACURE and DAROCUR from Ciba Specialty Chemical Corp., Tarrytown, N.Y. and include 1-hydroxy cyclohexyl phenyl ketone (IRGACURE 184), 2,2-dimethoxy-1,2-diphenylethan-1-one (IRGACURE 651), bis(2,4,6-trimethylbenzoyl)phenylphosphineoxide (IRGACURE 19), 1-[4-(2-hydroxyethoxy)phenyl]-2-hydroxy-2-methyl-1-propane-1-one (IRGACURE 2959), 2-benzyl-2-dimethylamino-1-(4-morpholinophenyl) butanone (IRGACURE 369), 2-methyl-1-[4-(methylthio) phenyl]-2-morpholinopropan-1-one (IRGACURE 907), and 2-hydroxy-2-methyl-1-phenyl propan-1-one (DAROCUR 1173).

Applying the coating composition (containing a polymerizable composition) on the metal traces and substrate may be performed by any conventional technique, including for instance and without limitation, bar coating, roll coating, curtain coating, rotogravure coating, knife coating, spray coating, spin coating, dip coating, or slide coating techniques. Coating techniques such as bar coating, roll coating, and knife coating are often used to control the thickness of the coating. The thickness of the coating composition applied to the visible light transparent thickness is not particularly limited, and may be at least 0.1 micrometers, or at least 0.2 micrometers, or at least 0.3 micrometers, or at least 0.5 micrometers, or at least 0.7 micrometers, or at least 1 micrometer, or at least 2 micrometers, or even at least 3 micrometers; and up to 10 micrometers, or up to 9 micrometers, or up to 8 micrometers, or up to 7 micrometers, or up to 6 micrometers, or even up to 5 micrometers. In certain embodiments, the coating composition is applied at a thickness of between about 0.1 micrometers and about 10 micrometers, or of between about 0.2 micrometers and about 5 micrometers.

Following application of a coating composition, the coating is cured, usually by subjecting the coating to actinic radiation to polymerize the polymerizable composition according to conventional techniques (e.g., UV irradiation, e-beam irradiation, etc.) known to the skilled practitioner.

The visible light transparent substrate includes any substrate useful for conductors, for instance and without limitation including polyethylene terephthalate, polyethylene naphthalate, polycarbonate, polyimide, cycloolefin films, poly(methyl methacrylate), or combinations thereof.

In certain embodiments, the first metal comprises silver. In certain embodiments, the second metal comprises gold, platinum, or palladium. As noted above, each salt of gold, platinum, and palladium oxidizes silver, and thus each is suitable for use as a noble metal salt to include in the polymerizable composition when the metal traces are made of silver. In some embodiments, the plurality of metal traces on the visible light transparent substrate comprise a metal mesh, a plurality of metal nanowires, or both a metal mesh and metal nanowires. In certain embodiments, obtaining the visible light transparent substrate comprises forming a plurality of metal traces on the substrate. The skilled practitioner will understand suitable methods for forming metal traces on a substrate, for instance using the methods of forming metal nanowire conductive layers on substrates disclosed in PCT Publication No. WO 2014/088950 (Dodds et al.) or using the method of forming metal mesh traces disclosed, for instance in U.S. Pat. No. 5,126,007 (Schmulovich); U.S. Pat. No. 5,492,611 (Sugama et al.); or U.S. Pat. No. 6,775,907 (Boyko et al.).

The layer of the second metal is a reaction product of the first metal and a noble metal salt of the second metal by applying the polymerizable composition on a portion of the plurality of metal traces and at least a portion of the visible light transparent substrate, the polymerizable coating composition comprising at least one noble metal salt of the second metal dispersed in the at least one ionic liquid monomer. In many embodiments, the coating layer further comprises a salt of the first metal produced upon the reaction of the noble metal salt (e.g., the second metal) with the metal trace (e.g., the first metal). The second metal is disposed on the metal traces (e.g., the first metal) only in locations on the metal traces that were in contact with the polymerizable composition. In contrast to placing metal traces in a solution containing a noble metal salt, applying a polymerizable composition to metal traces disposed on a substrate limits the surfaces of the metal traces exposed to the noble metal salt present in the polymerizable composition.

Suitable noble metal salts include for example and without limitation, $HAuCl_4$, $PdCl_2$, and $H_2PtCl_6$. The noble metal salt is present in the coating layer or in the polymerizable composition in an amount of at least 1 part per million (ppm) of the polymerizable composition or of the polymer, respectively, or at least 5 ppm, or at least 10 ppm, or at least 15 ppm, or at least 20 ppm, or at least 25 ppm, or at least 30 ppm, and up to 90 ppm of the polymerizable composition or polymer, or up to 80 ppm, or up to 70 ppm, or up to 60 ppm, or up to 50 ppm, or up to 40 ppm, such as between 1 ppm and 90 ppm of the polymerizable composition or polymer or between 10 ppm and 40 ppm of the polymerizable composition or polymer. The noble metal salt should be present in the polymerizable composition or polymer in at least an amount effective to form a structured surface on the metal traces. As noted above, in certain embodiments the structured surface comprises a random structure, a nanoscale structure, or both a random structure and a nanoscale structure.

Advantageously, the structured surface often results in decreased haze and reflectance of the transparent conductor. More particularly, the transparent conductor preferably has an optical haze that is less than 1.6%, or less than 1.5%, or less than 1.4%, or less than 1.3%, or even less than 1.2%.

Figure 4A:
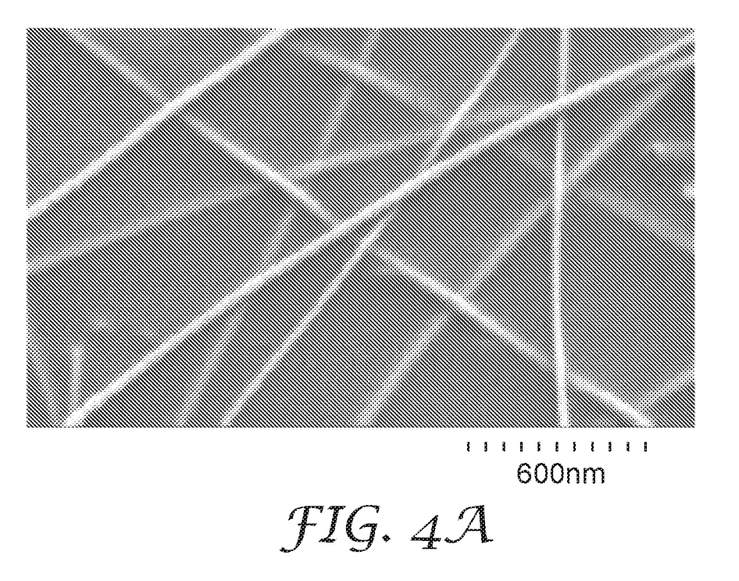
FIG. 4A is a scanning electron microscope (SEM) image of a transparent conductor including a silver nanowire-coated polyethylene terephthalate (PET) film.
Figure 4B:
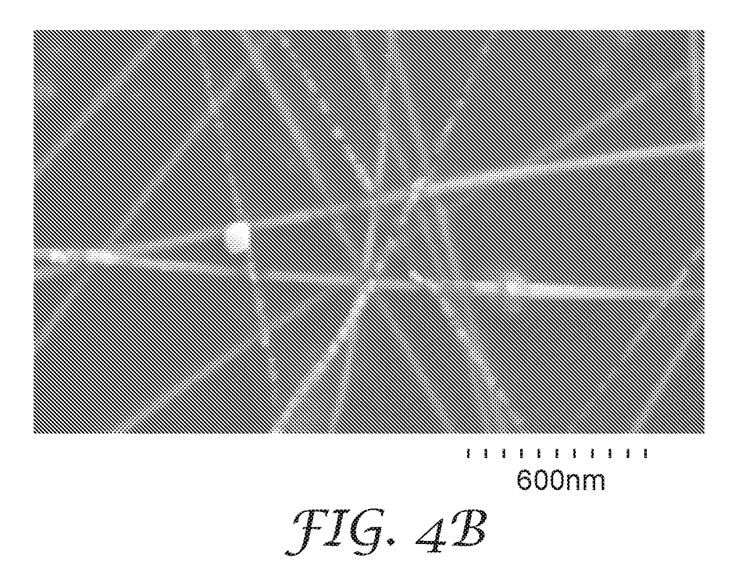
FIG. 4B is a SEM image of a portion of an exemplary transparent conductor according to the disclosure.

Referring to FIG. 4A, a scanning electron microscope (SEM) image is provided of a transparent conductor including a silver nanowire-coated polyethylene terephthalate (PET) film. In contrast, FIG. 4B provides a SEM image of a portion of an exemplary transparent conductor according to Example 1 (i.e., using 24 ppm of ARC), disclosed in detail below. A difference in surface appearance of the silver nanowires between the silver nanowires in FIG. 4A and the silver nanowires oxidized by $HAuCl_4$ in FIG. 4B is evident.

The greater the amount of the noble metal salt in the polymerizable composition or polymer, the greater the extent of metal removal from the metal traces, which causes a concomitant reduction in conductance and increase is sheet resistance of the transparent conductor. In certain embodiments, the transparent conductor exhibits a surface resistivity of less than or equal to 100 ohms per square, or less than or equal to 75 ohms per square, or less than or equal to 50 ohms per square such that the transparent conductor remains conductive.

Use of the noble metal salt in the polymerizable composition or polymer above a certain threshold concentration allows for oxidation through the entire thickness of the metal trace in some locations, thereby eliminating the conductivity of the metal trace in those locations. For instance, for a transparent conductor having silver nanowire traces and a polymerizable composition including $HAuCl_4$, a concentration of the gold salt at or above about 40 ppm oxidizes through a sufficient amount of the silver nanowire thickness to result in a loss of measurable conductivity. This phenomenon can be used to tailor certain areas of a transparent conductor to be non-conductive, whereas other areas remain conductive. In certain embodiments, applying the coating composition comprises applying the coating composition on a portion of the plurality of metal traces in a pattern, for instance by applying at least a portion of the coating composition using a patterned stamp.

Figure 5:
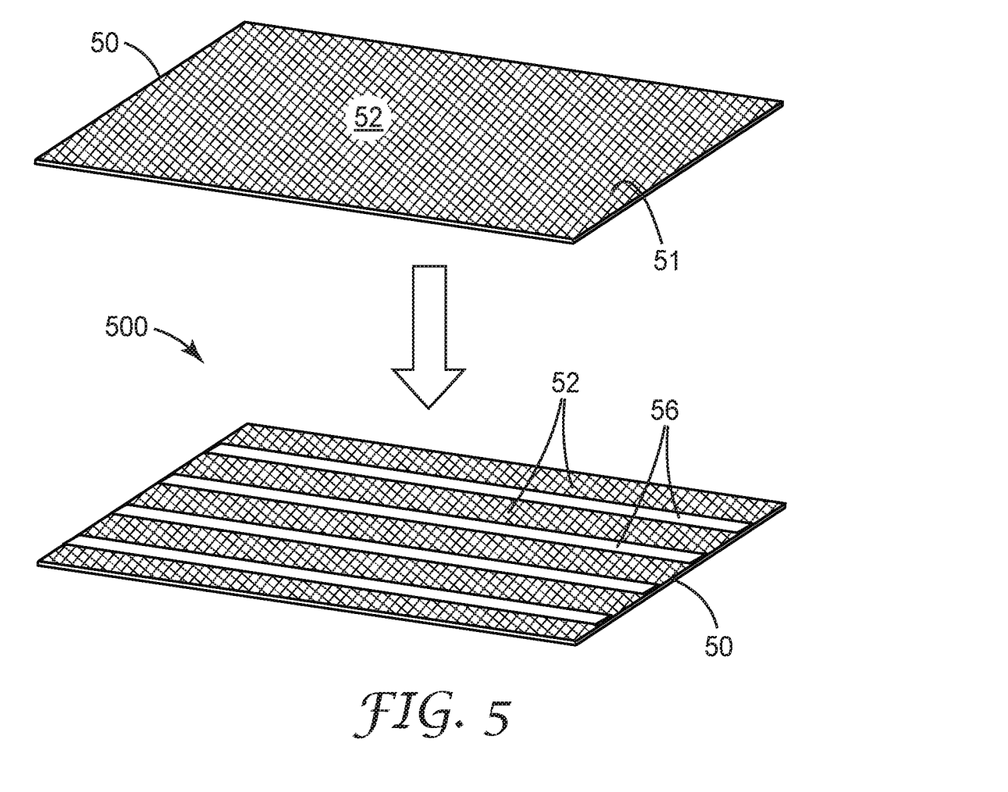
FIG. 5 is a schematic perspective view of a portion of an exemplary transparent conductor with selected nonconductive areas, according to the disclosure.

Referring to FIG. 5, a substrate 50 coated with silver nanowires 52 on a major surface 51 of the substrate 50 has a pattern of four wide lines 56 of polymerizable composition comprising a high concentration of noble metal salt printed on the silver nanowires 52. Following curing of the polymerizable composition and oxidation of the silver nanowires 52 in the locations of the printed polymer 56, a transparent conductor 500 is provided having non-conductive regions 56 and conductive regions 52. Such a method of patterning conductivity can provide a simpler process as compared to etching processes, etc. to achieve a patterned transparent conductor. Moreover, the particular composition of the polymerizable composition can be formulated to be permanently adhered to a substrate if desired.

In many embodiments, the method further comprises removing the coating layer from the visible light transparent substrate. A suitable method for removing exemplary coating layers from the visible light transparent substrate and metal traces includes applying a pressure sensitive adhesive tape on the major surface of the coating layer followed by peeling off the adhesive tape, thereby removing the coating layer with the adhesive tape. One example of a commercially available pressure sensitive adhesive tape is SCOTCH MAGIC tape from 3M Company (St. Paul, Minn.). Preferably, most or all of the coating layer material is removed from the visible light transparent substrate and metal traces, though some minor amounts of coating layer residue may remain without affecting the performance of the transparent conductor. Depending on the composition of a specific coating layer, other methods of removing the coating layer may also be employed.

A useful characteristic of exemplary transparent conductors of the present disclosure is that the transparent conductor preferably has a visible light transmission between 350 nm and 850 nm of greater than 85%. Such a visible light transmission typically appears transparent to the unaided eye.

EXEMPLARY EMBODIMENTS

Embodiment 1 is a transparent conductor comprising:
a visible light transparent substrate;
a plurality of metal traces disposed on a major surface of the substrate, the metal traces comprising a first metal and having a structured surface; and
a layer of a second metal deposited on a portion of the structured surface of the plurality of metal traces, wherein the layer conforms to the portion of the structured surface on which it is deposited.

Embodiment 2 is the transparent conductor of embodiment 1, wherein the structured surface comprises a random structure.

Embodiment 3 is the transparent conductor of embodiment 1 or embodiment 2, wherein the structured surface comprises a nanoscale structure.

Embodiment 4 is the transparent conductor of any of embodiments 1 to 3, wherein the transparent conductor has an optical haze that is less than 1.6%.

Embodiment 5 is the transparent conductor of any of embodiments 1 to 4, wherein the transparent conductor has an optical haze that is less than 1.4%.

Embodiment 6 is the transparent conductor of any of embodiments 1 to 5, wherein the transparent conductor has an optical haze that is less than 1.2%.

Embodiment 7 is the transparent conductor of any of embodiments 1 to 6, wherein the first metal comprises silver.

Embodiment 8 is the transparent conductor of any of embodiments 1 to 7, wherein the second metal comprises gold, platinum, or palladium.

Embodiment 9 is the transparent conductor of any of embodiments 1 to 8, wherein the second metal is capable of oxidizing the first metal.

Embodiment 10 is the transparent conductor of any of embodiments 1 to 9, wherein the transparent conductor has a surface resistivity of less than or equal to 100 ohms per square.

Embodiment 11 is the transparent conductor of any of embodiments 1 to 10, wherein the transparent conductor has a surface resistivity of less than or equal to 75 ohms per square.

Embodiment 12 is the transparent conductor of any of embodiments 1 to 11, wherein the transparent conductor has a surface resistivity of less than or equal to 50 ohms per square.

Embodiment 13 is the transparent conductor of any of embodiments 1 to 12, wherein the visible light transparent substrate comprises polyethylene terephthalate, polyethylene naphthalate, polycarbonate, polyimide, cycloolefin films, poly(methyl methacrylate), or combinations thereof.

Embodiment 14 is the transparent conductor of any of embodiments 1 to 13, wherein the plurality of metal traces comprise a metal mesh.

Embodiment 15 is the transparent conductor of any of embodiments 1 to 13, wherein the plurality of metal traces comprise a plurality of nanowires.

Embodiment 16 is a transparent conductor comprising:
a visible light transparent substrate;
a plurality of metal traces disposed on a major surface of the substrate, the metal traces comprising a first metal;
a layer of a second metal deposited on a portion of the plurality of metal traces; and
a coating layer disposed on the layer of the second metal and at least a portion of the visible light transparent substrate, the coating layer comprising a polymer prepared from a polymerizable composition comprising at least one ionic liquid monomer.

Embodiment 17 is the transparent conductor of embodiment 16, wherein the layer of the second metal is a reaction product of the first metal and a noble metal salt of the second metal by applying the polymerizable composition on a portion of the plurality of metal traces and at least a portion of the visible light transparent substrate, the polymerizable coating composition comprising at least one noble metal salt of the second metal dispersed in the at least one ionic liquid monomer.

Embodiment 18 is the transparent conductor of embodiment 16 or embodiment 17, wherein the coating layer further comprises a salt of the first metal.

Embodiment 19 is the transparent conductor of any of embodiments 16 to 18, wherein the transparent conductor has an optical haze that is less than 1.6%.

Embodiment 20 is the transparent conductor of any of embodiments 16 to 19, wherein the transparent conductor has an optical haze that is less than 1.4%.

Embodiment 21 is the transparent conductor of any of embodiments 16 to 20, wherein the metal traces comprise silver.

Embodiment 22 is the transparent conductor of any of embodiments 16 to 21, wherein the noble metal salt comprises $HAuCl_4$, $PdCl_2$, or $H_2PtCl_6$.

Embodiment 23 is the transparent conductor of any of embodiments 16 to 22, wherein the noble metal salt is capable of oxidizing the first metal.

Embodiment 24 is the transparent conductor of any of embodiments 16 to 23, wherein the noble metal salt is present in the coating layer in an amount of between 1 parts per million (ppm) and 90 ppm of the polymer.

Embodiment 25 is the transparent conductor of any of embodiments 16 to 24, wherein the noble metal salt is present in the coating layer in an amount of between 10 ppm and 40 ppm of the polymer.

Embodiment 26 is the transparent conductor of any of embodiments 16 to 25, wherein the at least one ionic liquid monomer comprises a polymerizable anion and a cation of the formula:

wherein
Z comprises a ketone, ester, amide, nitrile, or azlactone functional group,
$R^1$ is H or a $C_1$-$C_{25}$ alkyl group,
$R^2$ is H or —CO—$X^1$—$R^5$, where $R^5$ is a H or a $C_1$-$C_{25}$ alkyl group and $X^1$ is —O— or —$NR_6$—, where $R^6$ is H or a $C_1$-$C_6$ alkyl; and
$R^3$ is H or $CH_3$,
$R^8$ is a (hetero)hydrocarbyl group, and w is 0, 1, 2 or 3; with the proviso that when Z comprises a nitrile or azlactone functional group, then $R^1$ and $R^2$ is H.

Embodiment 27 is the transparent conductor of embodiment 26, wherein the polymerizable anion comprises an ethylenically unsaturated polymerizable group and an acidic group selected from a carboxylic acid group (—COOH), a sulfonic acid group (—$SO_3H$), a sulfate group (—$SO_4H$), a phosphonic acid group (—$PO_3H_2$), a phosphate group (—$OPO_3H$), or a salt thereof.

Embodiment 28 is the transparent conductor of any of embodiments 16 to 27, wherein the at least one ionic liquid monomer comprises trimethylacryloxyethyl ammonium bis(trifluoromethyl)sulfonamide.

Embodiment 29 is the transparent conductor of any of embodiments 16 to 28, wherein the polymerizable composition further comprises at least one acrylate monomer.

Embodiment 30 is the transparent conductor of any of embodiments 16 to 29, wherein the polymerizable composition further comprises at least one adhesive monomer having a glass transition temperature less than −10 degrees Celsius, or less than −30 degrees Celsius, or less than −50 degrees Celsius.

Embodiment 31 is the transparent conductor of any of embodiments 16 to 30, wherein the coating layer is disposed on the portion of the plurality of metal traces in a pattern.

Embodiment 32 is the transparent conductor of any of embodiments 16 to 31, wherein the transparent conductor has a surface resistivity of less than or equal to 100 ohms per square.

Embodiment 33 is the transparent conductor of any of embodiments 16 to 32, wherein the transparent conductor has a surface resistivity of less than or equal to 50 ohms per square.

Embodiment 34 is the transparent conductor of any of embodiments 16 to 33, wherein the visible light transparent substrate comprises polyethylene terephthalate, polyethylene naphthalate, polycarbonate, polyimide, cycloolefin films, poly(methyl methacrylate), or combinations thereof.

Embodiment 35 is the transparent conductor of any of embodiments 16 to 34, wherein the transparent conductor has a visible light transmission between 350 nm and 850 nm greater than 85%.

Embodiment 36 is the transparent conductor of any of embodiments 16 to 35, wherein the plurality of metal traces comprise a metal mesh.

Embodiment 37 is the transparent conductor of any of embodiments 16 to 36, wherein the plurality of metal traces comprise a plurality of nanowires.

Embodiment 38 is a method of forming a transparent conductor comprising:
obtaining a visible light transparent substrate comprising a plurality of metal traces disposed on a major surface of the substrate; and
applying a coating composition on a portion of the plurality of metal traces and at least a portion of the visible light transparent substrate, the coating composition comprising at least one noble metal salt and at least one polymerizable ionic liquid monomer.

Embodiment 39 is the method of embodiment 38, further comprising exposing the coating to irradiation to polymerize the at least one polymerizable ionic liquid monomer, thereby forming a coating layer.

Embodiment 40 is the method of embodiment 38 or embodiment 39, further comprising removing the coating layer from the visible light transparent substrate.

Embodiment 41 is the method of any of embodiments 38 to 40, wherein the obtaining the visible light transparent substrate comprises forming a plurality of metal traces on the substrate.

Embodiment 42 is the method of any of embodiments 38 to 41, wherein the coating composition is applied at a thickness of between about 0.1 micrometers and about 10 micrometers.

Embodiment 43 is the method of any of embodiments 38 to 42, wherein the coating composition is applied at a thickness of between about 0.2 micrometers and about 5 micrometers.

Embodiment 44 is the method of any of embodiments 38 to 43, wherein the coating composition comprises less than 1% of solvent.

Embodiment 45 is the method of any of embodiments 38 to 44, wherein the ionic liquid monomer solubilizes the noble metal salt in the coating composition.

Embodiment 46 is the method of any of embodiments 38 to 45, wherein the applying the coating composition comprises applying the coating composition on a portion of the plurality of metal traces in a pattern.

Embodiment 47 is the method of any of embodiments 38 to 46, wherein the applying the coating composition comprises applying at least a portion of the coating composition using a patterned stamp.

Embodiment 48 is the method of any of embodiments 38 to 47, wherein the transparent conductor has an optical haze that is less than 1.6%.

Embodiment 49 is the method of any of embodiments 38 to 48, wherein the transparent conductor has an optical haze that is less than 1.4%.

Embodiment 50 is the method of any of embodiments 38 to 49, wherein the transparent conductor has an optical haze that is less than 1.2%.

Embodiment 51 is the method of any of embodiments 38 to 50, wherein the metal traces comprise silver.

Embodiment 52 is the method of any of embodiments 38 to 51, wherein the noble metal salt comprises $HAuCl_4$, $PdCl_2$, or $H_2PtCl_6$.

Embodiment 53 is the method of any of embodiments 38 to 52, wherein the noble metal salt is capable of oxidizing the metal traces.

Embodiment 54 is the method of any of embodiments 38 to 53, wherein the noble metal salt is present in the coating composition in an amount of between 1 parts per million (ppm) and 90 ppm of the polymer.

Embodiment 55 is the method of any of embodiments 38 to 54, wherein the noble metal salt is present in the coating composition in an amount of between 10 ppm and 40 ppm of the polymer.

Embodiment 56 is the method of any of embodiments 38 to 55, wherein the at least one ionic liquid monomer comprises a polymerizable anion and a cation of the formula:

wherein
Z comprises a ketone, ester, amide, nitrile, or azlactone functional group,
$R^1$ is H or a $C_1$-$C_{25}$ alkyl group,
$R^2$ is H or —CO—$X^1$—$R^5$, where $R^5$ is a H or a $C_1$-$C_{25}$ alkyl group and $X^1$ is —O— or —$NR^6$—, where $R^6$ is H or a $C_1$-$C_6$ alkyl; and
$R^3$ is H or $CH_3$,
$R^8$ is a (hetero)hydrocarbyl group, and w is 0, 1, 2 or 3; with the proviso that when Z comprises a nitrile or azlactone functional group, then $R^1$ and $R^2$ is H.

Embodiment 57 is the method of embodiment 56, wherein the polymerizable anion comprises an ethylenically unsaturated polymerizable group and an acidic group selected from a carboxylic acid group (—COOH), a sulfonic acid group (—$SO_3H$), a sulfate group (—$SO4_H$), a phosphonic acid group (—$PO_3H_2$), a phosphate group (—$OPO_3H$), or a salt thereof.

Embodiment 58 is the method of any of embodiments 38 to 57, wherein the at least one ionic liquid monomer comprises trimethylacryloxyethyl ammonium bis(trifluoromethyl)sulfonamide.

Embodiment 59 is the method of any of embodiments 38 to 58, wherein the polymerizable composition further comprises at least one adhesive monomer having a glass transition temperature less than 0 degrees Celsius, or less than −30 degrees Celsius, or less than −50 degrees Celsius.

Embodiment 60 is the method of any of embodiments 38 to 59, wherein the polymerizable composition further comprises at least one adhesion promoting monomer.

Embodiment 61 is the method of any of embodiments 38 to 60, wherein the polymerizable composition further comprises at least one acrylate monomer.

Embodiment 62 is the method of any of embodiments 38 to 61, wherein the transparent conductor has a surface resistivity of less than or equal to 100 ohms per square.

Embodiment 63 is the method of any of embodiments 38 to 62, wherein the transparent conductor has a surface resistivity of less than or equal to 50 ohms per square.

Embodiment 64 is the method of any of embodiments 38 to 63, wherein the visible light transparent substrate comprises polyethylene terephthalate, polyethylene naphthalate, polycarbonate, polyimide, cycloolefin films, poly(methyl methacrylate), or combinations thereof.

Embodiment 65 is the method of any of embodiments 38 to 64, wherein the transparent conductor has a visible light transmission between 350 nm and 850 nm greater than 85%.

Embodiment 66 is the method of any of embodiments 38 to 65, wherein the plurality of metal traces comprise a metal mesh.

Embodiment 67 is the method of any of embodiments 38 to 66, wherein the plurality of metal traces comprise a plurality of nanowires.

EXAMPLES

These Examples are merely for illustrative purposes and are not meant to be overly limiting on the scope of the appended claims. Notwithstanding that the numerical ranges and parameters setting forth the broad scope of the present disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

Summary of Materials

Unless otherwise noted, all parts, percentages, ratios, etc. in the Examples and the rest of the specification are by weight.

TABLE 1

| | Materials | |
|---|---|---|
| Material | Description | Vendor |
| SR610 | Polyethylene glycol (600) diacrylate, | Sartomer; Exton, PA |
| SR444 | Pentaerythritol triacrylate | Sartomer; Exton, PA |
| SR415 | 20 mole ethoxylated trimethylolpropane triacrylate | Sartomer; Exton, PA |

TABLE 1-continued

Materials

| Material | Description | Vendor |
|---|---|---|
| IRGACURE 184 | 1-Hydroxy-cyclohexyl-phenyl-ketone | BASF; New York, NY |
| DAROCUR 4265 | 2-Hydroxy-2-methyl-1-phenyl-propan-1-one; 2,4,6-Trimethylbenzoyl-diphenyl-phosphineoxide | BASF; Florham Park, NJ |
| VISCOAT 190 | 2-Ethoxyethoxyethyl acrylate | San Esters Corporation; New York, NY |
| $HAuCl_4^-$ $3H_2O$ | Chloroauric acid | Alfa Aesar; Ward Hill, MA |
| ARC ionic liquid monomer | Trimethylacryloxyethyl ammonium bis(trifluoromethyl)sulfonamide was prepared as described in US20120288675 (POS-1) and schematically shown below:  | N/A |
| Silver Nanowire Coated PET Films | Silver nanowire transparent conductor coatings (TCC) were prepared on the primed side of 5 mil PET film (Teijin DuPont 504) using CLEAROHM Ink-N AQ (silver nanowire dispersion), Diluent-N AQ, SFT-E AQ Surfactant Solution, were obtained from Cambrios Technologies (Sunnyvale, CA). | N/A |
| Copper Mesh Films | The copper substrate was prepared as described in U.S. Pat. No. 8,703,232 B2. Example #3. | N/A |

Test Methods:

Optical Property Measurements:

The haze (% H) and transmission (% T) were measured using a Haze-Guard Plus from BYK-Gardner USA, Columbia, Md. Reflectance measurements of the coated silver nanowire PET films were conducted using a Perkin Elmer 950 UV/Vis Spectrophotometer. Measurements were taken every 5 nm across the band from 350 nm to 800 nm. The average reflectance from 450 nm to 700 nm is reported herein.

Conductivity Measurements:

SEM Images:

Pieces of the samples were attached to an SEM stub, contacted to the stub using carbon paint, and a thin layer of gold/palladium was deposited to make the samples conductive. Imaging: Performed using a Hitachi S-4500 field emission scanning electron microscope.

Imaging conditions: 3.0 KV, 10 mm wd, lower detector, CL=5, tilt: 30°Magnifications: 5 kx, 15 kx, 50 kx Sheet Resistance Measurements:

Sheet resistance of the resulting of transparent conducting films was measured using a contactless probe Delcom 727R Non-Contact Conductance Monitor from Delcom Products Inc.

Experiments:

Preparation of Stock ARC-Au solution (320 ppm): The formulation was made as follows: 0.08 g of HAuCl4.3H2O and 24.96 g of ARC monomer were added to a brown 2 ounce (~59 mL) jar, then the brown jar was placed in an ultrasonic water bath for 30 minutes to completely dissolve the chloroauric acid.

Example 1

Example 1A: Preparation of Stock ARC-Au Solution (24 ppm)

The formulation was made as follows: In a 2 ounce (~59 mL) brown bottle, 1.5 g of ARC-Au stock solution, 21 g of ARC monomer, and 0.45 g of IRGACURE 184 were mixed together. Then the brown bottle was placed in an ultrasonic water bath to dissolve the IRGACURE 184 to form a coating solution.

Example 1B: Preparation of Stock ARC-Au Solution (32 ppm)

The formulation was made as follows: In a 2 ounce (~59 mL) brown bottle, 2.5 g of ARC-Au stock solution, 22.5 g of ARC monomer, and 0.5 g of IRGACURE 184 were mixed together. Then the brown bottle was placed in an ultrasonic water bath to dissolve the IRGACURE 184 to form a coating solution.

The coating solutions were coated on Ag—NW coated PET films (50 ohms/square) using a #5 wire-round rod (available from R.D. Specialties, Webster, N.Y.), and then the coating was cured with a Light Hammer 6 ultraviolet processor under a nitrogen atmosphere at 100% power with a belt speed of 30 feet/minute (9.1 meters/minute) for 2 passes. The optical data was measured and shown in Table 1 below. For average reflectance between 450 nm and 700 nm, the reflectance of Ag—NW before and after coating with the ARC-Au solutions (i.e., Example 1A and Example 1B) was measured, and the reflectance difference ($\Delta\% R$) is reported in the table.

TABLE 1

| | Au concentration | Haze % | T % | Δ % R (average) |
|---|---|---|---|---|
| Example 1A | 24 ppm | 1.2 | 86.4 | −0.054 |
| Example 1B | 32 ppm | 1.1 | 86.3 | −0.103 |
| Ag—NW | 0 | 1.7 | 88.5 | 0 |

The ARC-Au salt based formulations do not have good adhesion to the Ag nanowire film. Thus, the ARC-Au coating can be removed by applying MAGIC 810 tape and then peeling the tape off quickly. After peeling off the overcoat, the optical data was further measured as shown below in Table 2. For Ag—NW samples coated with ARC-Au (24 ppm) and ARC-Au (32 ppm), the samples were renamed Example 1C and Example 1D after removing the coating using MAGIC 810 tape.

TABLE 2

| | Au concentration | Haze % | T % | Δ % R (average) |
|---|---|---|---|---|
| Example 1C | 24 ppm | 1.4 | 88.9 | −0.667 |
| Example 1D | 32 ppm | 1.2 | 89.1 | −0.751 |
| Ag—NW | 0 | 1.7 | 88.5 | 0 |

SEM studies were conducted on the samples of Ag NW film coated using ARC-24 ppm solution, followed by removing the coating using MAGIC tape. As shown in FIG. 4, surface etching on the silver nanowire was clearly observed after the ARC-24 ppm coating treatment. The etching mostly leads to a rougher surface at the nanoscale that may contribute to a decrease of the reflection of silver nanowire films. An over-dose of chloroauric acid can lead to disconnected nanoparticles along the template of silver nanowires and lead to a significant decrease of conductivity. Over-dose of chloroauric acid does tend to darken the silver nanowire film. Accordingly, the balance of conductivity and visibility of silver nanowire treated by this method is impacted by the concentration of noble metal salt included in the coating.

Example 2

Preparation of Coating Formulations:

Example 2A

In a small jar, 5 g of ARC monomer and 0.5 g of DAROCUR 4265 were mixed together.

Example 2B

In a small jar, 2.5 g of ARC monomer was mixed with 2.5 g of SR610 and 0.5 g of DAROCUR 4265.

Example 2C

In a small jar, 2.5 g of ARC monomer was mixed with 2.5 g of VISCOAT 190 and 0.5 g of DAROCUR 4265.

Example 2D

In a small jar, 2.5 g of ARC monomer was mixed with 2.5 g of SR444 and 0.5 g of DAROCUR 4265.

Example 2E

In a small Jar, 2.5 g of ARC monomer was mixed with 0.8 g of VISCOAT 190 and 1.7 g of SR415 and 0.5 g of DAROCUR 4265.

The coating solutions were each coated on Ag—NW coated PET films (40 ohms/square) using a #5 wire-round rod (available from R.D. Specialties, Webster, N.Y.), and then the coating was cured with a Light Hammer 6 ultraviolet processor under a nitrogen atmosphere at 100% power with a belt speed at 30 feet/minute (9.1 meters/minute) for 2 passes. The optical and conductivity properties are shown below in Table 3.

TABLE 3

| ID | Surface Resistivity (ohms/square) | Haze % | % T |
|---|---|---|---|
| Ag—NW | 38.4 | 1.6 | 88.5 |
| Example 2A | 39.1 | 1.4 | 88.2 |
| Example 2B | 39.8 | 1.5 | 88 |
| Example 2C | 46.2 | 1.4 | 87.9 |
| Example 2D | 39.2 | 1.3 | 87.7 |
| Example 2E | 43.2 | 1.4 | 87.9 |

Example 3

Preparation of Coating Formulations:

Example 3A 10.46 g of ARC monomer, 7.84 g of SR610, 2.615 g of VISCOAT 190, and 0.38 g of IRGACURE 184 were added to form a clear coating solution.

Example 3B 1.45 g of ARC-Au stock solution, 13.12 g of ARC monomer, 10.83 g of SR610, 3.6 g of VISCOAT 190, and 0.46 g of IRGACURE 184 were added to form a clear coating solution.

Example 3C 1.74 g of ARC-Au stock solution, 11.3 g of ARC monomer, 9.79 g of SR610, 3.26 g of VISCOAT 190, and 0.5 g of IRGACURE 184 were added to form a clear coating solution.

Example 3D 1.89 g of ARC-Au stock solution, 7.72 g of ARC monomer, 6.96 g of SR610, 2.32 g of VISCOAT 190, and 0.36 g of IRGACURE 184 were added to form a clear coating solution.

The coating solutions were coated on Ag—NW coated PET films (40 ohms/square) using a #5 wire-round rod (available from R.D. Specialties, Webster, N.Y.), and then the coating was cured with a Light Hammer 6 ultraviolet processor under a nitrogen atmosphere at 100% power with a belt speed of 30 feet/minute (9.1 meters/minute) for 2 passes. The optical and conductivity properties are shown below in Table 4.

TABLE 4

| ID | Au (ppm) | Coating Thickness (microns) | Surface Resistance (ohms/square) | Haze % | T % |
|---|---|---|---|---|---|
| Ag—NW | | 0 | 38.1 | 1.7 | 88.5 |
| 3A | 0 | 7.1 | 40.7 | 1.5 | 87.9 |

TABLE 4-continued

| ID | Au (ppm) | Coating Thickness (microns) | Surface Resistance (ohms/square) | Haze % | T % |
|---|---|---|---|---|---|
| 3B | 16 | 7.7 | 54.2 | 1.3 | 87.2 |
| 3C | 24 | 8.9 | 66.0 | 1.2 | 86.7 |
| 3D | 32 | 8.9 | 77.5 | 1.2 | 86.6 |

Room temperature aging studies on the optic and conductivity changes were completed and the results are shown below in Table 5.

TABLE 5

| ID | Au (ppm) | Surface Resistance (ohms/ square) - initial | Surface Resistance (ohms/ square) - Day 3 | Surface Resistance (ohms/ square) - Day 8 | Haze % - initial | Haze % Day 3 |
|---|---|---|---|---|---|---|
| 3A | 0 | 40.7 | 46.8 | 45.2 | 1.5 | 1.4 |
| 3B | 16 | 54.2 | 59.1 | 58.7 | 1.3 | 1.1 |
| 3C | 24 | 66.0 | 73.4 | 72.8 | 1.2 | 1.0 |
| 3D | 32 | 77.5 | 92.3 | 88.1 | 1.2 | 1.0 |

Comparative Example 4

Formulations were prepared by diluting an ARC-Au stock solution, using SR610, to 160 ppm Au concentration, and then adding 2% by weight of IRGACURE 184.

Coating solutions according to the formulations of Examples 3A, 3D, and 4 above were applied on copper mesh films using a #5 wire-round rod (available from R.D. Specialties, Webster, N.Y.), and then the coatings were each cured with a Light Hammer 6 ultraviolet processor under a nitrogen atmosphere at 100% power with belt speed at 30 feet/minute (9.1 meters/minute) for 2 passes. Upon applying the coating formulations of Examples 3D and 4, the color of copper was enhanced and appeared more "red"-like. Thus, the trace became more "visible". The optical data are shown below in Table 6.

TABLE 6

| ID | Haze % | T % |
|---|---|---|
| Copper Mesh-No coating | 99.5 | 72.5 |
| Example 4 | 69 | 64.9 |
| Example 3D | 83.7 | 66.3 |
| Example 3A | 81.7 | 66.3 |

Example 5

Preparation of Coating Formulation:

2.42 g of ARC-Au stock solution, 2.38 g of 2-hydroxyethylacrylate, 4.88 g of SR444, 21 g of 1-methoxy-2-propanol and 0.22 g of IRGACURE 184 were mixed together to form a slightly yellow coating solution. The concentration of Au was 80 ppm.

The coating solutions were coated on Ag—NW coated PET films (~40 ohms/square) using a #5 wire-round rod (available from R.D. Specialties, Webster, N.Y.), and then the coating was cured with a Light Hammer 6 ultraviolet processor under a nitrogen atmosphere at 100% power with a belt speed of 30 feet/minute (9.1 meters/minute) for 2 passes. The conductivity of control Ag—NW coated PET film was measured as 43.8 ohms/square. After the coating formulation of Example 5, the conductivity of Ag—NW was no longer detectable using a Delcom contactless probe. This indicated that the conductivity of Ag—NW was successfully turned off using the coating.

Example 6

As described in Example 5 above, the conductivity of a selected printed area can be turned off. As shown in FIG. 5, the Ag—NW coating was not patterned, etched, or removed. Therefore, no reflection/scattering contrast was created between conductive and non-conductive areas because the printing ink (the Example 5 coating formulation) matches the refractive index of standard optically clear adhesives (OCA). After OCA lamination, an invisibly patterned Ag—NW film can be created.

The experiment was performed as described below:

A patterned layer of the coating formulation of Example 5 was printed onto a 40 Ohms/Square silver nanowire layer that was previously coated onto a Dupont ST-504 5 mil (127 micrometers) PET substrate. The printed pattern was made by hand using the following procedure, which was designed to emulate conventional flexographic printing:

A thin coating of the coating formulation of Example 5 was deposited onto a donor layer of 3 mil (76.2 micrometers) PET, using a #9 Meyer rod A 0.067 inch (1.7 millimeter (mm)) Dupont DPR Flexoplate was mounted to a circular aluminum mandrel using 3M E1120 Flexographic plate mounting tape. The stamp had a pattern array of rectangular bars approximately 5 mm wide and 6 inches (152.4 mm) long, with a 6.5 mm pitch.

The flexo stamp of (2) was pressed into the liquid coating of (1), transferring portions of the liquid coating to the relief features of the stamp.

The wetted stamp of (2) was then pressed against the silver nanowire coated substrate, transferring ink from the relief features of the stamp to nanowire substrate.

The patterned coating on the nanowire substrate was cured with a Fusion UV system using a H-bulb operating at 100% power under nitrogen with a belt speed of 30 feet/minute (9.1 meters/minute) for a total of two passes. The printed and cured pattern was estimated to be between 0.5 and 3.0 micrometers thick.

While the specification has described in detail certain exemplary embodiments, it will be appreciated that those skilled in the art, upon attaining an understanding of the foregoing, may readily conceive of alterations to, variations of, and equivalents to these embodiments. Furthermore, all publications and patents referenced herein are incorporated by reference in their entirety to the same extent as if each individual publication or patent was specifically and individually indicated to be incorporated by reference. Various exemplary embodiments have been described. These and other embodiments are within the scope of the following claims.

What is claimed is:

1. A transparent conductor comprising:
   a visible light transparent substrate;
   a plurality of metal traces disposed on a major surface of the substrate, the metal traces comprising a first metal;
   a layer of a second metal deposited on a portion of the plurality of metal traces; and
   a coating layer disposed on the layer of the second metal and at least a portion of the visible light transparent substrate, the coating layer comprising a polymer prepared from a polymerizable composition comprising at least one ionic liquid monomer, the at least one ionic liquid monomer comprising at least one onium salt having an anion, the anion being a fluoroorganic anion, wherein the polymerizable composition comprises a noble metal salt of the second metal in an amount between 1 parts per million (ppm) and 90 ppm of the polymer.

2. The transparent conductor of claim 1, wherein the layer of the second metal is a reaction product of the first metal and the noble metal salt of the second metal by applying the polymerizable composition on a portion of the plurality of metal traces and at least a portion of the visible light transparent substrate.

3. The transparent conductor of claim 1, wherein the coating layer further comprises a salt of the first metal.

4. The transparent conductor of claim 1, wherein the noble metal salt of the second metal comprises $HAuCl_4$, $PdCl_2$, or $H_2PtCl_6$.

5. The transparent conductor of claim 1, wherein the coating layer is disposed on the portion of the plurality of metal traces in a pattern.

6. The transparent conductor of claim 1, wherein the at least one ionic liquid monomer comprises a polymerizable anion and a cation of the formula:

wherein
Z comprises a ketone, ester, amide, nitrile, or azlactone functional group,
$R^1$ is H or a $C_1$-$C_{25}$ alkyl group,
$R^2$ is H or —CO—$X^1$—$R^5$, where $R^5$ is a H or a $C_1$-$C_{25}$ alkyl group and $X^1$ is —O— or —$NR_6$—, where $R^6$ is H or a $C_1$-$C_6$ alkyl; and
$R^3$ is H or $CH_3$,
$R^8$ is a (hetero)hydrocarbyl group, and w is 0, 1, 2 or 3; with the proviso that when Z comprises a nitrile or azlactone functional group, then $R^1$ and $R^2$ is H.

7. The transparent conductor of claim 6, wherein the polymerizable anion comprises an ethylenically unsaturated polymerizable group and an acidic group selected from a carboxylic acid group (—COOH), a sulfonic acid group (—$SO_3H$), a sulfate group (—$SO_4H$), a phosphonic acid group (—$PO_3H_2$), a phosphate group (—$OPO_3H$), or a salt thereof.

8. The transparent conductor of claim 1, wherein the at least one ionic liquid monomer comprises trimethylacryloxyethyl ammonium bis(trifluoromethyl)sulfonamide.

9. The transparent conductor of claim 1 having an optical haze that is less than 1.6%.

10. The transparent conductor of claim 1 having a surface resistivity of less than or equal to 100 ohms per square.

11. The transparent conductor of claim 1, wherein the noble metal salt is capable of oxidizing the first metal.

12. A method of forming a transparent conductor comprising:
obtaining a visible light transparent substrate comprising a plurality of metal traces disposed on a major surface of the substrate; and
applying a coating composition on a portion of the plurality of metal traces and at least a portion of the visible light transparent substrate, the coating composition comprising at least one noble metal salt and at least one polymerizable ionic liquid monomer,
wherein the applying the coating composition comprises applying the coating composition on a portion of the plurality of metal traces in a pattern, and
wherein the at least one polymerizable ionic liquid monomer comprises at least one of:
(i) trimethylacryloxyethyl ammonium bis(trifluoromethyl)sulfonamide; and
(ii) a polymerizable anion and a cation of the formula:

wherein
Z comprises a ketone, ester, amide, nitrile, or azlactone functional group,
$R^1$ is H or a $C_1$-$C_{25}$ alkyl group,
$R^2$ is H or —CO—$X^1$—$R^5$, where $R^5$ is a H or a $C_1$-$C_{25}$ alkyl group and $X^1$ is —O— or —$NR_6$—, where $R^6$ is H or a $C_1$-$C_6$ alkyl; and
$R^3$ is H or $CH_3$,
$R^8$ is a (hetero)hydrocarbyl group, and w is 0, 1, 2 or 3;
with the proviso that when Z comprises a nitrile or azlactone functional group, then $R^1$ and $R^2$ is H.

13. The method of claim 12, wherein the coating composition comprises less than 1% of solvent.

14. The method of claim 12, wherein the plurality of metal traces comprise a metal mesh.

15. A transparent conductor comprising:
a visible light transparent substrate;
a plurality of metal traces disposed on a major surface of the substrate, the metal traces comprising a first metal;
a layer of a second metal deposited on a portion of the plurality of metal traces; and
a coating layer disposed on the layer of the second metal and at least a portion of the visible light transparent substrate, the coating layer comprising a polymer prepared from a polymerizable composition comprising at least one ionic liquid monomer, the at least one ionic liquid monomer comprising at least one of:
(i) trimethylacryloxyethyl ammonium bis(trifluoromethyl)sulfonamide; and
(ii) a polymerizable anion and a cation of the formula:

wherein
Z comprises a ketone, ester, amide, nitrile, or azlactone functional group,
$R^1$ is H or a $C_1$-$C_{25}$ alkyl group,
$R^2$ is H or —CO—$X^1$—$R^5$, where $R^5$ is a H or a $C_1$-$C_{25}$ alkyl group and $X^1$ is —O— or —$NR_6$—, where $R^6$ is H or a $C_1$-$C_6$ alkyl; and
$R^3$ is H or $CH_3$,
$R^8$ is a (hetero)hydrocarbyl group, and w is 0, 1, 2 or 3;

with the proviso that when Z comprises a nitrile or azlactone functional group, then $R^1$ and $R^2$ is H.

16. The transparent conductor of claim 15, wherein the at least one ionic liquid monomer comprises trimethylacryloxyethyl ammonium bis(trifluoromethyl)sulfonamide.

17. The transparent conductor of claim 15, wherein the at least one ionic liquid monomer comprises the polymerizable anion and the cation.

* * * * *

UNITED STATES PATENT AND TRADEMARK OFFICE
CERTIFICATE OF CORRECTION

PATENT NO. : 10,564,780 B2  
APPLICATION NO. : 15/747958  
DATED : February 18, 2020  
INVENTOR(S) : Encai Hao et al.

Page 1 of 1

It is certified that error appears in the above-identified patent and that said Letters Patent is hereby corrected as shown below:

In the Specification

<u>Column 5</u>  
Lines 26-27, delete "$Pd^{2+} 2Ag^0 \rightarrow 2Ag^- + Pd^0;$" and insert -- $Pd^{2+} + 2Ag^0 \rightarrow 2Ag^+ + Pd^0;$ --, therefor.

<u>Columns 17-18</u>  
Lines 13-14, delete "$HAuCl_4^- 3H_2O$" and insert -- $HAuCl_4 \cdot 3H_2O$ --, therefor.

<u>Column 17</u>  
Line 55, delete "30°Magnifications:" and insert -- 30° Magnifications: --, therefor.

Signed and Sealed this  
Fourth Day of August, 2020

Andrei Iancu  
*Director of the United States Patent and Trademark Office*